(12) United States Patent
Kim et al.

(10) Patent No.: US 9,853,097 B2
(45) Date of Patent: Dec. 26, 2017

(54) ORGANIC LIGHT EMITTING DIODE DISPLAY INCLUDING PIXEL HAVING SHIELDING ELECTRODE

(71) Applicant: LG Display Co., Ltd., Seoul (KR)

(72) Inventors: Nakwoo Kim, Paju-si (KR); Jaeho Sim, Daegu (KR); Donghyun Yeo, Seoul (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 15/299,364

(22) Filed: Oct. 20, 2016

(65) Prior Publication Data

US 2017/0154944 A1  Jun. 1, 2017

(30) Foreign Application Priority Data

Nov. 27, 2015 (KR) .................. 10-2015-0167485

(51) Int. Cl.
*H01L 29/08* (2006.01)
*H01L 27/32* (2006.01)

(52) U.S. Cl.
CPC ...... *H01L 27/3276* (2013.01); *H01L 27/3225* (2013.01); *H01L 27/3272* (2013.01)

(58) Field of Classification Search
CPC ............. H01L 27/3276; H01L 27/3225; H01L 27/3272
See application file for complete search history.

(56) References Cited

U.S. PATENT DOCUMENTS

| | | | |
|---|---|---|---|
| 2007/0069205 A1 | 3/2007 | Jinno | |
| 2010/0079419 A1* | 4/2010 | Shibusawa | H01L 27/3272 345/204 |
| 2014/0167009 A1 | 6/2014 | Lee et al. | |
| 2015/0206931 A1* | 7/2015 | Choi | H01L 27/3272 257/72 |

FOREIGN PATENT DOCUMENTS

| | | |
|---|---|---|
| EP | 1365277 A2 | 11/2003 |
| EP | 2498242 A1 | 9/2012 |
| JP | 2000-352941 A | 12/2000 |
| KR | 20130030879 A * | 3/2013 |

OTHER PUBLICATIONS

European Extended Search Report, European Application No. 16187747.7, dated May 3, 2017, 9 pages.

* cited by examiner

*Primary Examiner* — Matthew Gordon
(74) *Attorney, Agent, or Firm* — Fenwick & West LLP

(57) ABSTRACT

An organic light emitting display in which each pixel has a driving thin film transistor for adjusting the current flowing through an organic light emitting diode based on a voltage applied to a gate electrode, includes the gate electrode of the driving thin film transistor; a signal line adjacent to the gate electrode of the driving thin film transistor; and a first shielding electrode located above the gate electrode of the driving thin film transistor, with a first insulating layer therebetween, wherein the first shielding electrode extends further towards the signal line than the gate electrode of the driving thin film transistor.

20 Claims, 8 Drawing Sheets

ORGANIC LIGHT EMITTING DIODE DISPLAY INCLUDING PIXEL HAVING SHIELDING ELECTRODE

CROSS REFERENCE TO RELATED APPLICATIONS

This application claims the priority benefit of Korean Patent Application No. 10-2015-0167485 filed on Nov. 27, 2015, which is hereby incorporated herein by reference for all purposes as if fully set forth herein.

BACKGROUND

Field of the Disclosure

The present disclosure relates to an organic light emitting diode display.

Discussion of the Related Art

Recently, various flat panel displays that are less bulky and lighter than cathode ray tubes (CRTs) are being developed. Examples of the flat panel displays include liquid crystal displays (LCDs), field emission displays (FEDs), plasma display panels (PDPs), organic light emitting diode displays (OLEDs), etc. Among these types of flat panel displays, the organic light emitting diode displays are self-luminous displays that emit light through excitation of organic compounds. In contrast to LCDs the organic light emitting diode displays work without a backlight; thus, organic light emitting diode displays can be lighter and thinner and made in a simplified process. Also, the organic light emitting diode displays are widely used because they can be manufactured at low temperatures, have a fast response time of 1 ms or less, and feature low power consumption, wide viewing angle, and high contrast.

An organic light emitting diode display comprises an organic light emitting diode that converts electrical energy into light energy. The organic light emitting diode comprises an anode, a cathode, and an organic emission layer situated between the anode and cathode. A hole is ejected from the anode, and an electron is ejected from the cathode. Once the hole from the anode and the electron from the cathode are injected into an organic emission layer EML, they form an exciton and this exciton releases its energy as light to emit light.

In such an organic light emitting diode display, each pixel comprises a switching thin film transistor and a driving thin film transistor, in order to apply a driving signal to the anode in a display area. The switching thin film transistor functions to select a pixel. The driving thin film transistor serves to drive the organic light emitting diode of the pixel selected by the switching thin film transistor.

In line with the rising demand for high resolutions needed for larger display sizes, pixel sizes are becoming smaller and smaller. One pixel is defined by the intersection of a gate line, a data line, and a common power supply line. In this pixel, a switching thin film transistor, a driving thin film transistor, a storage capacitor, and an organic light emitting diode are formed, or located. With this configuration, the thin film transistors and the above-mentioned lines can be integrated due to the smaller pixel size, so they are arranged very close to each other.

A parasitic capacitor is formed between the driving thin film transistor's gate electrode and a line adjacent to it, for example, a data line to which a data voltage is applied. In this instance, the gate voltage applied to the gate electrode of the driving thin film transistor changes due to a change in the data voltage applied to the data line. A change in the gate voltage due to interference from the data voltage leads to a change in the gate-source voltage Vgs of the driving thin film transistor. The user will perceive this as a vertical crosstalk. The vertical crosstalk degrades the display quality and reliability of the display device. Therefore, there is a need for an effort to solve this problem.

SUMMARY

Accordingly, an embodiment of the present disclosure is directed to an organic light emitting diode display that has a shielding electrode in order that a gate voltage applied to a driving thin film transistor's gate electrode is not affected by changes in the voltage of an adjacent line.

An organic light emitting display including pixels in which each pixel has a driving thin film transistor for adjusting the current flowing through an organic light emitting diode based on a voltage applied to a gate electrode of the driving thin film transistor, the organic light emitting display further includes a signal line adjacent to the gate electrode of the driving thin film transistor; and a first shielding electrode located above the gate electrode of the driving thin film transistor, and a first insulating layer between the first shielding electrode and the gate electrode of the driving thin film transistor, wherein the first shielding electrode extends further towards the signal line than the gate electrode of the driving thin film transistor.

Preferably, the distance between the signal line and the first shielding electrode is shorter than the distance between the signal line and the gate electrode of the driving thin film transistor.

The first shielding electrode may be configured to be connected to a first static voltage source.

The first shielding electrode may be configured to be a first capacitor to suppress pixel voltage discharge. This suppression of pixel voltage discharge may improve the data maintainability of each pixel.

The first capacitor may be formed by the overlapping of the first shielding electrode and the gate electrode of the driving thin film transistor. The first capacitor may have a higher capacitance than a parasitic capacitor that may be formed between the signal line and the gate electrode of the driving thin film transistor.

The organic light emitting diode display may be as described above but further comprising: a second shielding electrode located below the gate electrode of the driving thin film transistor; and a second insulating layer between the second shielding electrode located below the gate electrode of the driving thin film transistor, wherein the second shielding electrode extends towards the signal line further than the gate electrode of the driving thin film transistor.

The distance between the signal line and the second shielding electrode may be shorter than the distance between the signal line and the gate electrode of the driving thin film transistor.

The second shielding electrode may be configured to be connected to a second static voltage source.

The second shielding electrode may be configured to be a second capacitor to suppress pixel voltage discharge. This suppression of pixel voltage discharge may improve the data maintainability of each pixel.

The second capacitor may be formed by the overlapping of the second shielding electrode and the gate electrode of the driving thin film transistor. The second capacitor may have a higher capacitance than the parasitic capacitor that may be formed between the signal line and the gate electrode of the driving thin film transistor.

In some cases, the first static voltage source and the second static voltage source are the same.

Each pixel may be configured in a six transistor and one capacitor structure.

The six transistor and one capacitor structure may comprise: a first thin film transistor comprising a gate electrode connected to a first gate line, a first electrode connected to a first data line, and a second electrode connected to one end of a storage capacitor; a second thin film transistor comprising a gate electrode connected to a second gate line, a first electrode connected to a gate electrode of the driving thin film transistor, and a second electrode connected to a second electrode of the driving thin film transistor; a third thin film transistor comprising a gate electrode connected to a third gate line, a first electrode connected to a reference voltage line, and a second electrode connected to one end of the storage capacitor; a fourth thin film transistor comprising a gate electrode connected to a third gate line, a first electrode connected to the second electrode of the driving thin film transistor, and a second electrode connected to the anode of the organic light emitting diode; a fifth thin film transistor comprising a gate electrode connected to the second gate line, a first electrode connected to the reference voltage line, and a second electrode connected to the anode of the organic light emitting diode; and the driving thin film transistor comprising the gate electrode connected to the other end of the storage capacitor, a first electrode connected to a first power supply, and a second electrode connected to the first electrode of the fourth thin film transistor.

In one embodiment, a light emitting display comprises a pixel having a driving thin film transistor to adjust a current flowing through a light emitting diode based on a voltage at a gate electrode of the driving thin film transistor. A signal line is adjacent to the gate electrode of the driving thin film transistor. A first shielding electrode overlaps with the gate electrode of the driving thin film transistor to provide electric field shielding between the signal line and the gate electrode, the signal line being closer to the first shielding electrode than the gate electrode of the driving thin film transistor.

BRIEF DESCRIPTION OF THE DRAWINGS

The accompanying drawings, which are included to provide a further understanding of the disclosure and are incorporated in and constitute a part of this specification, illustrate embodiments of the disclosure and together with the description serve to explain the principles of the disclosure. In the drawings.

DETAILED DESCRIPTION

Figure 1:
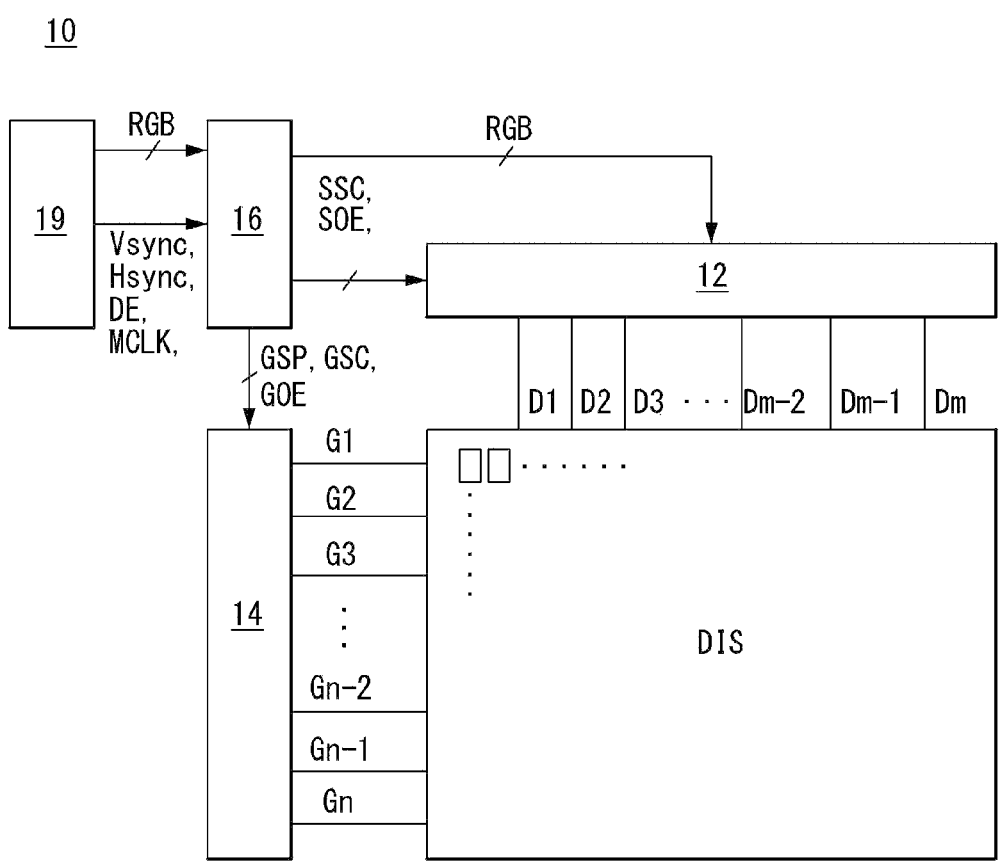
FIG. 1 is a view schematically illustrating an organic light emitting diode display according to the present disclosure.

Reference will now be made in detail to embodiments illustrated in the accompanying drawings. Wherever possible, the same reference numbers are used in the drawings and the description to refer to the same or like parts. Detailed description of known arts will be omitted if it is determined that the arts can mislead the reader regarding the embodiments of the disclosure. In describing various embodiments, descriptions of the same or like parts may be given with respect to a particular exemplary embodiment and, in light of this description and for conciseness, may be omitted in other exemplary embodiments.

Figure 2:
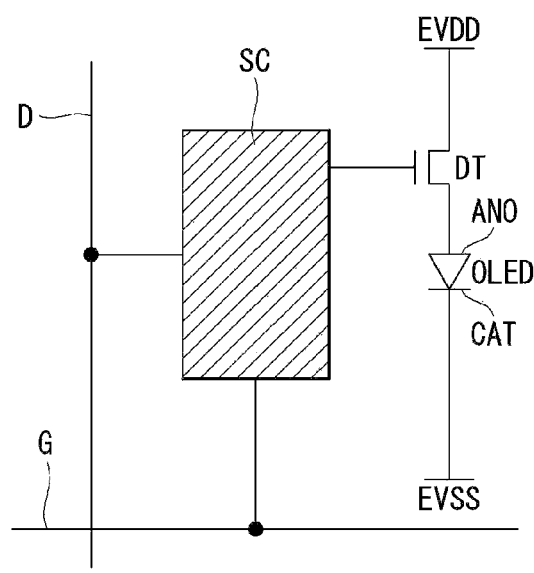
FIG. 2 is a configuration diagram schematically illustrating a pixel shown in FIG. 1.
Figure 3:
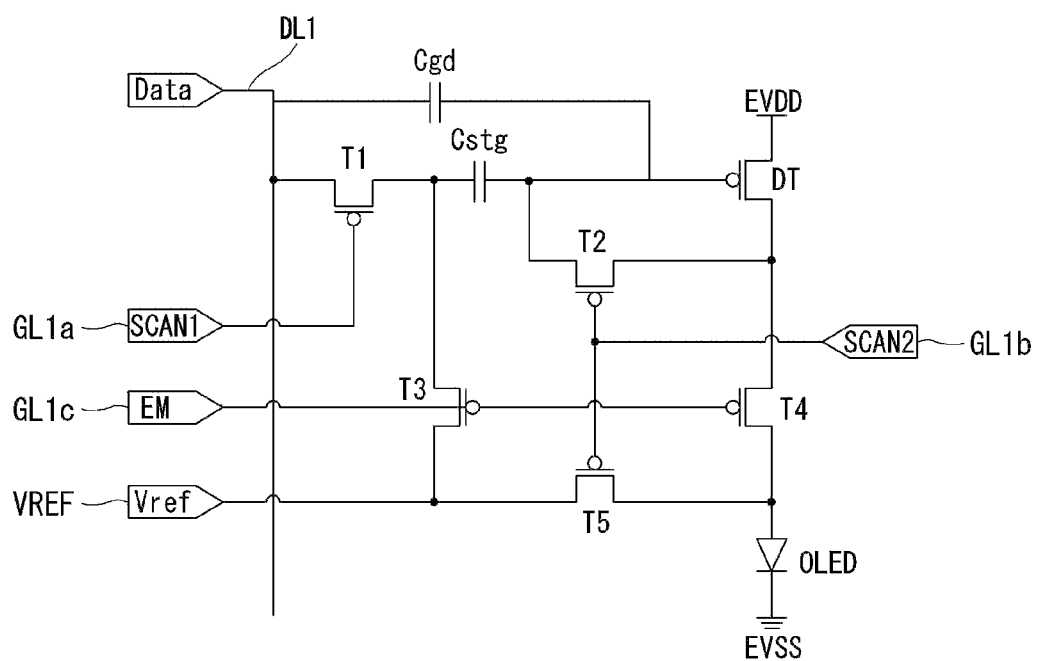
FIG. 3 is a view showing an example of the circuit configuration of the pixel of FIG. 2.

FIG. 1 is a view schematically illustrating an organic light emitting diode display according to the present disclosure. FIG. 2 is a configuration diagram schematically illustrating a pixel shown in FIG. 1. FIG. 3 is a view showing an example of the circuit configuration of the pixel of FIG. 2.

Referring to FIG. 1, an organic light emitting diode display 10 according to the present disclosure comprises a display driver circuit and a display panel DIS.

The display driver circuit comprises a data driver circuit 12, a gate driver circuit 14, and a timing controller 16, and writes, or applies, a video data voltage of an input image in the pixels of the display panel DIS. The data driver circuit 12 converts digital video data RGB input from the timing controller 16 to an analog gamma compensation voltage to generate a data voltage. The data voltage output from the data driver circuit 12 is supplied to data lines D1 to Dm. The gate driver circuit 14 sequentially supplies a gate pulse synchronized with the data voltage to gate lines G1 to Gn and selects pixels from the display panel DIS to write, or apply, the data voltage.

The timing controller 16 receives timing signals, such as a vertical synchronization signal Vsync, a horizontal synchronization signal Hsync, a data enable signal DE, a main clock MCLK, etc., input from a host system 19, and synchronizes the timings of operation of the data drive circuit 12 and gate drive circuit 14. Data timing control signals for controlling the data drive circuit 12 include a source sampling clock SSC, a source output enable signal SOE, etc. Gate timing control signals for controlling the gate drive circuit 14 include a gate start pulse GSP, a gate shift clock GSC, a gate output enable signal GOE, etc.

The host system 19 may be implemented as one among a television system, a set-top box, a navigation system, a DVD player, a Blu-ray player, a personal computer (PC), a home theater system, and a phone system. The host system 19 comprises a system-on-chip (SoC) with a scaler embedded in it, and converts the digital video data RGB of the input image into a data format suitable for display on the display panel DIS. The host system 19 transmits the digital video data RGB and the timing signals Vsync, Hsync, DE, and MCLK to the timing controller 16.

A pixel array in the display panel DIS comprises pixels formed, or located, in pixel areas defined by the data lines D1 to Dm (m is a positive integer) and the gate lines G1 to Gn (n is a positive integer). Each pixel comprises an organic light emitting diode (hereinafter, OLED), which is a self-luminous element.

Referring further to FIG. 2, a plurality of data lines D and a plurality of gate lines G cross each other on the display panel DIS, and pixels are arranged in a matrix at the crossings of the data lines D and the gate lines G. Each pixel comprise a driving thin film transistor (hereinafter, TFT) DT for controlling the amount of current flowing through the OLED, and a programming part SC for setting the gate-source voltage of the driving TFT DT.

The programming part SC may comprise at least one switching TFT and at least one storage capacitor. The switching TFT turns on in response to a scan signal from a gate line G to thereby apply a data voltage from a data line D to one electrode of the storage capacitor. The driving TFT DT adjusts the amount of light emitted by the OLED by controlling the amount of current supplied to the OLED based on the amount of voltage stored in the storage capacitor. The amount of light emitted by the OLED is proportional to the current supplied from the driving TFT DT. Such a pixel is connected to a high voltage source EVDD and a low voltage source EVSS and takes high voltage and low voltage from a power generator (not shown). The TFTs of the pixel may be implemented as p-type or n-type. Also, a semiconductor layer for the TFTs of the pixel may comprise amorphous silicon, or polysilicon, or oxide. The OLED comprises an anode ANO, a cathode CAT, and an organic compound layer interposed between the anode ANO and the cathode CAT. The anode ANO is connected to the driving TFT DT.

Referring to FIG. 3, a pixel may consist of 6 transistors and 1 capacitor (6T1C). However, the pixel configuration of the present disclosure is not limited to the 6T1C structure. That is, the present disclosure may use all types of OLED pixel structures that adjust the current flowing through the OLED using the driving TFT.

The TFTs included in the pixels to be described below are P-type TFTs, for example, but not limited thereto and may be N-type TFTs. The positions of source and drain electrodes may vary depending on the type of the TFTs, so the source and drain electrodes may be called a first electrode and a second electrode in the following description.

A first TFT T1 comprises a gate electrode connected to a 1$a$ gate line GL1$a$, a first electrode connected to a first data line DL1, and a second electrode connected to one end of a storage capacitor Cstg. The first TFT T1 serves to transmit a data signal supplied through the first data line DL1 to the storage capacitor Cstg, in response to a 1$a$ gate signal SCAN1.

A second TFT T2 comprises a gate electrode connected to a 1$b$ gate line GL1$b$, a first electrode connected to a gate electrode of a driving TFT DT, and a second electrode connected to a second electrode of the driving TFT DT. The second TFT T2 connects the gate electrode and source electrode node of the driving TFT DT in a diode connection, in response to a 1$b$ gate signal SCAN2.

A third TFT T3 comprises a gate electrode connected to a 1$c$ gate line GL1$c$, a first electrode connected to a reference voltage line VREF, and a second electrode connected to one end of the storage capacitor Cst. The third TFT T3 serves to supply a reference voltage Vref (or compensating voltage) to one end of the storage capacitor Cstg, in response to a 1$c$ gate signal EM.

A fourth TFT T4 comprises a gate electrode connected to a 1$c$ gate line GL1$c$, a first electrode connected to the second electrode of the driving TFT DT, and a second electrode connected to the anode of the organic light emitting diode OLED. The fourth TFT T4 serves to transmit driving current to the organic light emitting diode OLED to make it emit light, in response to the 1$b$ gate signal SCAN2.

A fifth TFT T5 comprises a gate electrode connected to the 1$b$ gate line GL1$b$, a first electrode connected to the reference voltage line VREF, and a second electrode connected to the anode of the organic light emitting diode OLED. The fifth TFT T5 serves to supply the reference voltage Vref to the anode of the organic light emitting diode OLED, in response to the 1$b$ gate signal SCAN2.

The driving TFT DT comprises the gate electrode connected to the other end of the storage capacitor Cstg, a first electrode connected to a first power supply (or high voltage source) EVDD, and a second electrode connected to the first electrode of the fourth TFT T4. The driving TFT DT turns on in response to a data voltage supplied from the storage capacitor Cstg and generates driving current to be supplied to the organic light emitting diode OLED.

The organic light emitting diode OLED comprises the anode connected to the second electrode of the fourth TFT T4 and a cathode connected to a second power supply (or low voltage source) EVSS. The organic light emitting diode OLED emits light by the driving current transmitted through the fourth TFT T4.

In this instance, a parasitic capacitor Cgd is formed between the gate electrode of the driving TFT DT and an adjacent line. The adjacent line refers to a line to which a signal different from the gate voltage applied to the gate electrode of the driving TFT DT is applied. For example, the parasitic capacitor Cgd may be formed between the gate electrode of the driving TFT DT and a first data line DLL The parasitic capacitor may cause degradation of display quality of the display device and introduce non-uniform luminance. This problem can be especially critical because many elements and lines are disposed adjacent to one another in a display device with high resolution.

Figure 4:
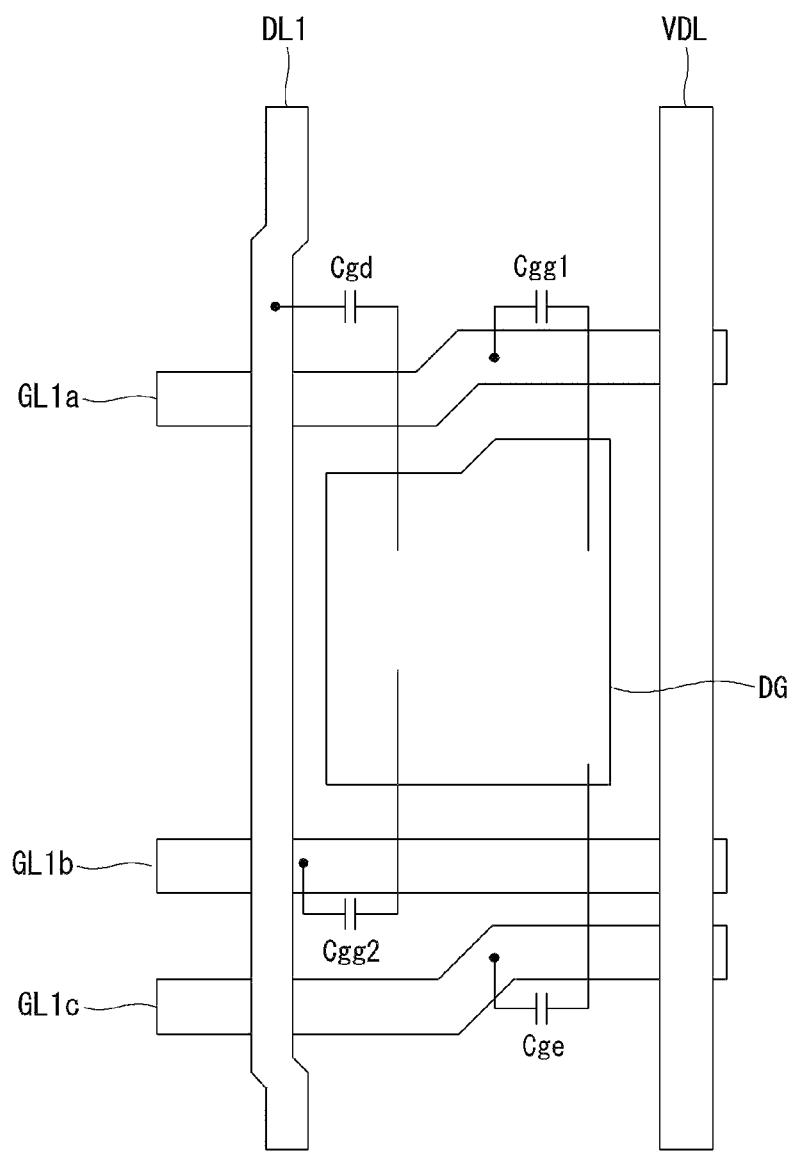
FIG. 4 is a top plan view schematically illustrating a driving TFT of a pixel and an area adjacent to it, in an organic light emitting diode display.

The above-mentioned problem will now be described concretely with further reference to FIG. 4. FIG. 4 is a top plan view schematically illustrating a driving TFT of a pixel and an area adjacent to it, in an organic light emitting diode display. It should be noted that FIG. 4 only schematically illustrates the distinctive elements of the present disclosure, i.e., the gate electrode of the driving TFT and adjacent signal lines, for convenience of explanation.

Referring to FIG. 4, the gate electrode DG of the driving TFT and signal lines adjacent to the gate electrode DG are formed, or located, in a pixel in the organic light emitting diode display. The signal lines may comprise a first data line DL1, a first power supply line VDL, a 1$a$ gate line GL1$a$, a 1$b$ gate line GL1$b$, and a 1$c$ gate line GL1$c$. A data voltage is applied to the first data line DL1. A high voltage is applied to the first power supply line VDL. Gate signals from the gate drive circuit are applied to the 1$a$ gate line GL1$a$, 1$b$ gate line GL1$b$, and 1$c$ gate line GL1$c$.

The driving TFT DT adjusts the amount of current flowing through the organic light emitting diode OLED based on the gate-source voltage Vgs. Since the gate electrode DG of the driving TFT DT and the first data line DL1 are coupled due to the parasitic capacitor Cgd between the gate electrode DG and the first data line DL1, an electrical field may form between the first data line DL1 and the gate electrode DG of the driving TFT DT. The gate-source voltage Vs of the driving TFT DT changes with a change in the data voltage applied to the first data line DL1, thus causing a change in the luminance of the pixel. Hence, the user will perceive a vertical crosstalk.

This problem may be more severe between the gate electrode DG of the driving TFT DT and an adjacent line, as well as between the gate electrode DG of the driving TFT DT and the first data line DL1. For example, parasitic capacitors Cgg1, Cgg2, and Cge may be formed between the gate electrode DG of the driving TFT DT and the 1$a$ gate line GL1$a$, between the gate electrode DG of the driving TFT DT and the 1$b$ gate line GL1$b$, and between the gate electrode DG of the driving TFT DT and the 1c gate line GL1c, and the above-described problem may occur due to the parasitic capacitors Cgg1, Cgg2, and Cge.

An embodiment of the present disclosure includes a shielding electrode so that a gate voltage applied to the driving TFT's gate electrode is not affected by changes in the voltage of an adjacent line. An embodiment of the present disclosure involves an organic light emitting diode display that is designed to shield an electric field generated between the gate electrode of the driving TFT and an adjacent line.

In an organic light emitting diode display, each pixel has a driving thin film transistor that adjusts the current flowing through the organic light emitting diode based on a voltage applied to the gate electrode. The organic light emitting diode display according to an embodiment of the present disclosure comprises the driving thin film transistor's gate electrode, a signal line adjacent to the gate electrode of the driving thin film transistor, and a first shielding electrode located above the gate electrode of the driving thin film transistor, with a first insulating layer between them. Thus, the insulating layer is between the first shielding electrode and the gate electrode of the driving thin film transistor. The first shielding electrode extends towards the signal line further than the gate electrode. The distance between the signal line and the first shielding electrode may be shorter than the distance between the signal line and the gate electrode. The signal line refers to a line to which a signal (or voltage) different from the gate voltage applied to the gate electrode of the driving thin film transistor is applied. The first shielding electrode is connected to a static voltage source. A static voltage source may also be referred to as a constant voltage source.

The organic light emitting diode display according to the present disclosure may further comprise a second shielding electrode. The second shielding electrode is located below the gate electrode of the driving thin film transistor, with a second insulating layer between them. The second shielding electrode extends towards the signal line further than the gate electrode of the driving thin film transistor. The distance between the signal line and the second shielding electrode may be shorter than the distance between the signal line and the gate electrode. The signal line refers to a line to which a signal different from the gate voltage applied to the gate electrode of the driving thin film transistor is applied. The second shielding electrode is connected to a static voltage source. As above, a static voltage source may also be referred to as a constant voltage source.

The organic light emitting diode display according to the present disclosure comprises a first capacitor. The first capacitor is formed by the overlapping of the first shielding electrode and the gate electrode of the driving thin film transistor, with an insulating layer between them. The first capacitor has a higher capacitance than a parasitic capacitor formed between the gate electrode of the driving thin film transistor and an adjacent signal line.

The organic light emitting diode display according to the present disclosure may further comprise a second capacitor. The second capacitor is formed by the overlapping of the second shielding electrode and the gate electrode of the driving thin film transistor, with an insulating layer between them. The second capacitor has a higher capacitance than a parasitic capacitor formed between the gate electrode of the driving thin film transistor and an adjacent signal line.

The characteristics of the present disclosure will now be described concretely with exemplary embodiments of the present disclosure.

<First Exemplary Embodiment>

Figure 5:
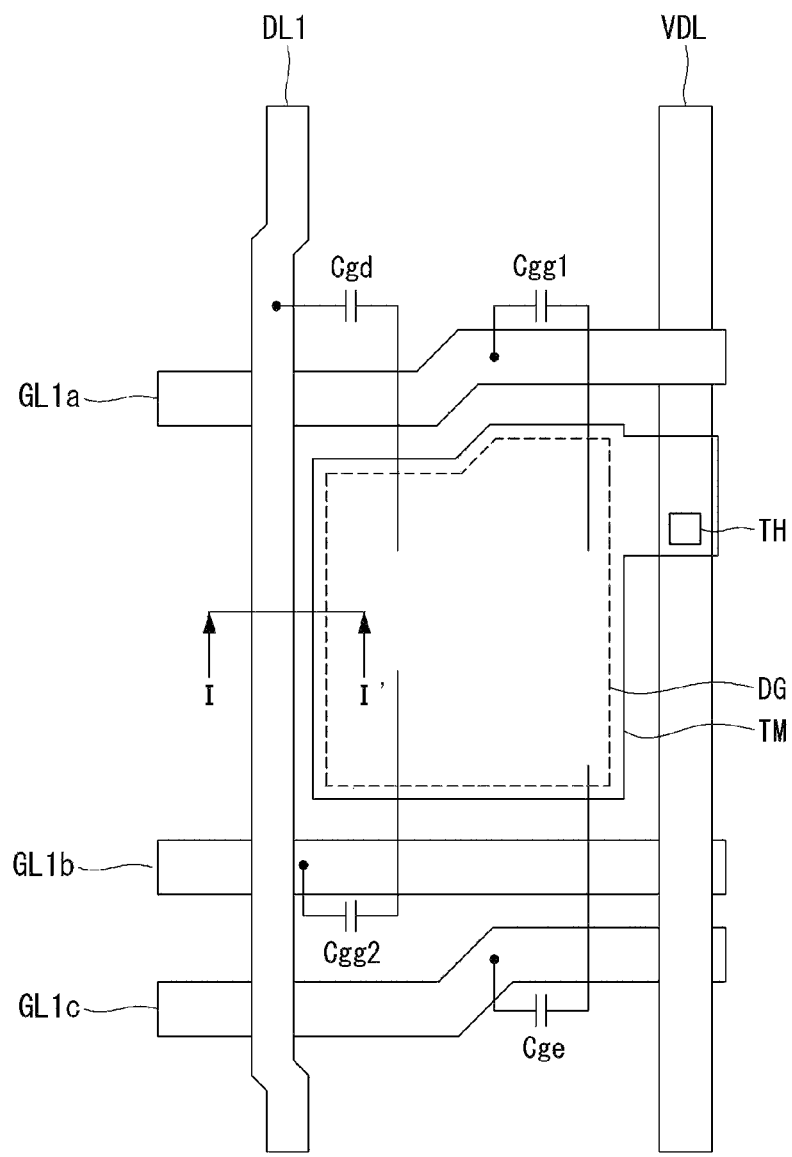
FIG. 5 is a top plan view schematically illustrating a driving TFT of a pixel and an area adjacent to it, in an organic light emitting diode display according to a first exemplary embodiment of the present disclosure.
Figure 6:
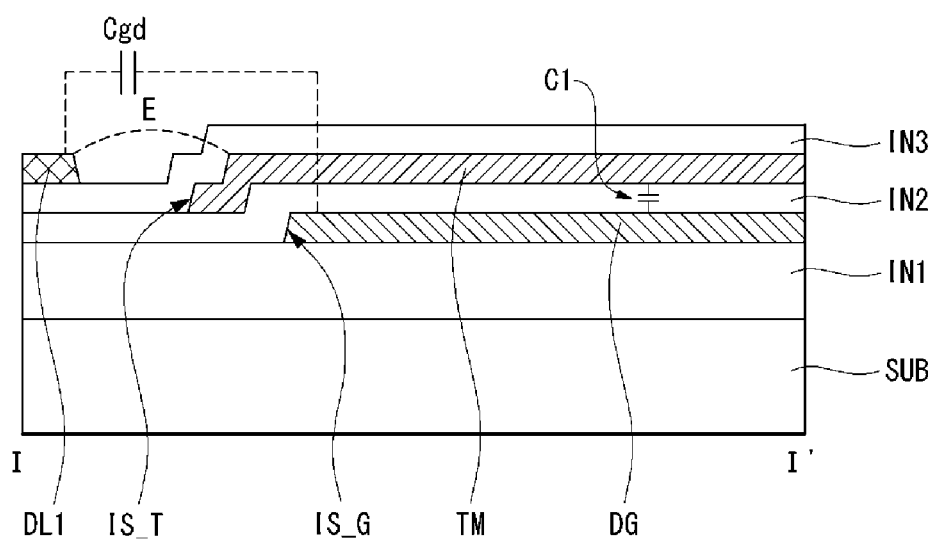
FIG. 6 is a cross-sectional view taken along I-I' of FIG. 5.

An organic light emitting diode display according to a first exemplary embodiment of the present disclosure will be described below in detail with reference to FIGS. 5 and 6. FIG. 5 is a top plan view schematically illustrating a driving TFT of a pixel and an area adjacent to it, in the organic light emitting diode display according to the first exemplary embodiment of the present disclosure. FIG. 6 is a cross-sectional view taken along I-I' of FIG. 5.

It should be noted that FIG. 5 only schematically illustrates some elements of the present disclosure, i.e., the gate electrode of the driving TFT and adjacent signal lines, for convenience of explanation.

Referring to FIGS. 5 and 6, the gate electrode DG of the driving TFT and a plurality of signal lines adjacent to the gate electrode DG are formed, or located, in a pixel in the organic light emitting diode display. For example, the signal lines may comprise a first data line DL1, a first power supply line VDL, a 1a gate line GL1a, a 1b gate line GL1b, and a 1c gate line GL1c. A data voltage is applied to the first data line DL1. A high voltage applied to the first power supply line VDL. Gate signals from the gate driver circuit are applied to the 1a gate line GL1a, 1b gate line GL1b, and 1c gate line GL1c.

The gate electrode DG of the driving TFT DT is located on a substrate SUB. A first insulating layer IN1 may be further formed, or located, under the gate electrode DG. The first data line DL1 is located above the gate electrode DG of the driving TFT DT, spaced horizontally apart from the gate electrode DG with a second insulating layer IN2 and a third insulating layer IN3 interposed between them. A parasitic capacitor Cgd is formed between the gate electrode DG of the driving TFT DT and the first data line DL1.

The organic light emitting diode display according to the first exemplary embodiment of the present disclosure further comprises a first shielding electrode TM formed, or located, between the gate electrode DG of the driving TFT DT and the first data line DL1. The first shielding electrode TM is located on a different layer than the gate electrode DG of the driving TFT DT, with the second insulating layer IN2 between them. The first shielding electrode TM is located on a different layer than the first data line DL1, with the third insulating layer IN3 between them.

The first shielding electrode TM overlaps the gate electrode DG of the driving DFT DT in such a way that fully covers the end of the gate electrode DG adjacent to the first data line DL1. In an area adjacent to the first data line DL1, the end of the first shielding electrode TM extends further towards the first data line DL1 than the end of the gate electrode DG. Accordingly, the end of the first shielding electrode TM is located closer in the horizontal direction to the first data line DL1 than the end of the gate electrode DG. Additionally, the first shielding electrode TM can be larger in size than the gate electrode DG, can completely overlap the gate electrode DG, and can extend beyond the gate electrode DG on all sides.

The first shielding electrode TM is connected to a static voltage source. For example, the static voltage source may be a high voltage source EVDD. To this end, the first shielding electrode TM may be electrically connected to the first power supply line VDL through a first contact hole TH.

When the first shielding electrode TM is connected to the static voltage source, the first shielding electrode TM maintains a static voltage. A first capacitor C1 is formed between the first shielding electrode TM and the gate electrode DG of the driving TFT DT. That is, the first shielding electrode TM and the gate electrode DG of the driving TFT DT overlap each other, with the second insulating layer IN2 between them, thereby forming the first capacitor C1 between them. The first shielding electrode TM is one plate of the capacitor, and the gate electrode DG is another plate of the capacitor.

The greater the capacitance of a capacitor, the larger the amount of charge in the capacitor. When a plurality of capacitors are connected to the gate electrode DG of the driving TFT DT, the gate voltage at the gate electrode DG is primarily affected by the capacitor with the higher capacitance. The first capacitor C1 has a higher capacitance value than the parasitic capacitor Cgd between the driving TFT DT of the first data line DL1 and the gate electrode DG, and this reduces the effect of the parasitic capacitor Cgd on the gate electrode DG of the driving TFT DT. Due to this, the gate voltage at the driving TFT DT is not affected by the parasitic capacitor Cgd; thus, it is not sensitive to changes in data voltage. Since the voltage at the first shielding electrode TM connected to the first capacitor C1 is constant, the voltage at the gate electrode DG is not affected by the voltage at the first shielding electrode TM even though the gate electrode DG of the driving TFT DT is coupled to the first shielding electrode TM through the first capacitor C1. In an embodiment of the present disclosure, in order for the first capacitor C1 to have a higher capacitance than the parasitic capacitor Cgd, it is preferable that the first shielding electrode TM protrudes past the end of the gate electrode, and thereby extends further towards the first data line DL1 than the gate electrode DG of the driving TFT DT does, so as to overlap the gate electrode DG over a large area.

The first shielding electrode TM extending further towards the first data line DL1 provides an electric field (E) shielding effect. In other words, the first shielding electrode TM may exist between the gate electrode DG of the driving TFT DT and the first data line DL1 to shield an electric field E formed between them, thereby keeping the gate voltage at the driving TFT DT from being affected by the data voltage.

As discussed above, it is preferable that the end IS_T of the first shielding electrode TM protrudes further towards the first data line DL1 than the end IS_G of the gate electrode DG, in order to give the first capacitor C1 a higher capacitance value than that of the parasitic capacitor Cgd and to shield an electric field E formed between the gate electrode DG of the driving TFT DT and the first data line DL1. With the first shielding electrode TM extending further towards the first data line DL1, the present disclosure can minimize the effect of the data voltage on the gate electrode DG of the driving TFT DT and, as a result, prevent a vertical crosstalk that occurs when the gate voltage at the driving TFT DT changes with a change in data voltage.

Moreover, the first capacitor C1 formed between the first shielding electrode TM and the gate electrode DG of the driving TFT DT functions as a storage capacitor. It is preferable that the first shielding electrode TM overlaps the gate electrode DG of the driving TFT DT over a wide area, in order for the storage capacitor to have a sufficient capacitance. Therefore, when the storage capacitor has sufficient capacitance, the present disclosure can improve the ability of the pixels to maintain their data and to suppress pixel voltage discharge when the pixels run at a low refresh rate for reduced power consumption, thereby enhancing the picture quality even during low refresh rates.

An embodiment of the present disclosure has a first shielding electrode TM, so that a gate voltage applied to the driving TFT DT's gate electrode DG is not affected by changes in the voltage of an adjacent line. The adjacent line is not limited to the above-described data line to which a data voltage is applied. The adjacent line may include any line, as long as a signal different from the gate voltage applied to the gate electrode DG of the driving TFT DT is applied to the adjacent line and the adjacent line is located adjacent to the gate electrode DG of the driving TFT DT. For example, the adjacent line may include the 1a gate line GL1a, the 1b gate line GL1b, and the 1c gate line GL1c.

<Second Exemplary Embodiment>

Figure 7:
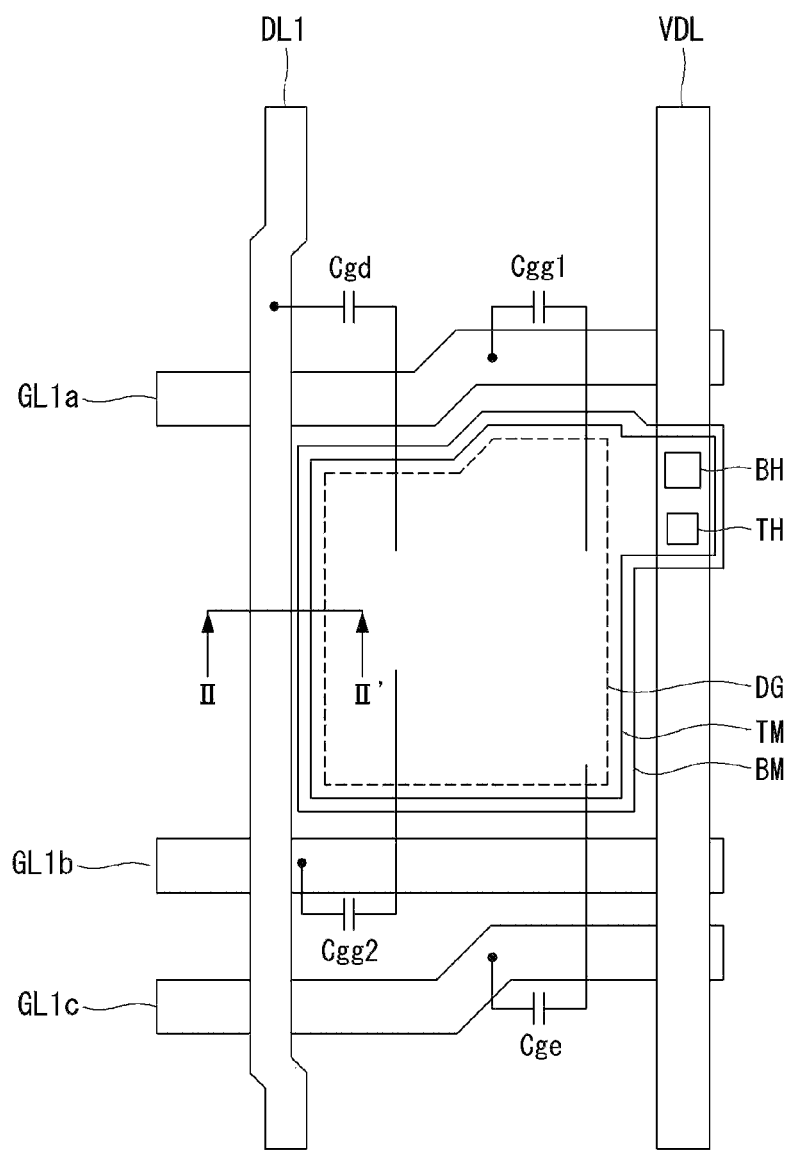
FIG. 7 is a top plan view schematically illustrating a driving TFT of a pixel and an area adjacent to it, in an organic light emitting diode display according to a second exemplary embodiment of the present disclosure.
Figure 8:
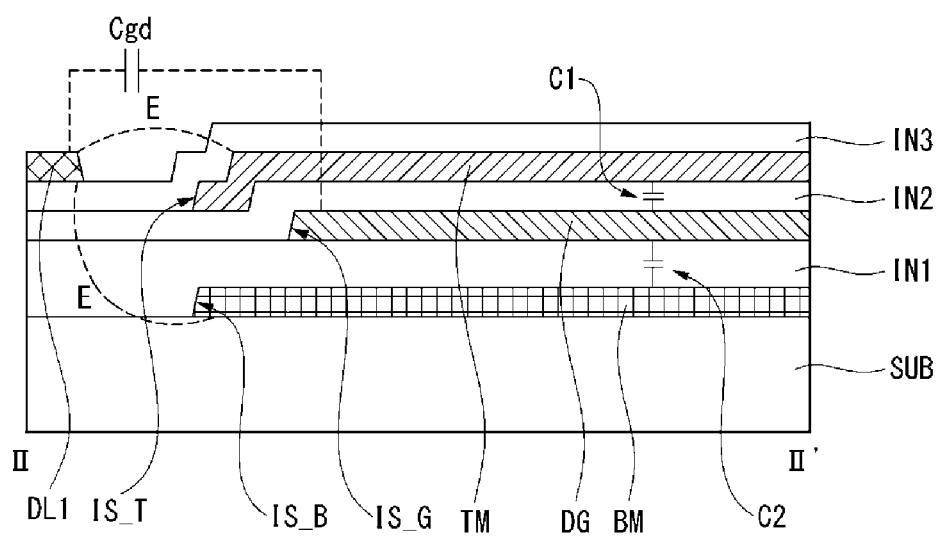
FIG. 8 is a cross-sectional view taken along II-II' of FIG. 7.

An organic light emitting diode display according to a second exemplary embodiment of the present disclosure will be described below in detail with reference to FIGS. 7 and 8. FIG. 7 is a top plan view schematically illustrating a driving TFT of a pixel and an area adjacent to it, in an organic light emitting diode display according to a second exemplary embodiment of the present disclosure. FIG. 8 is a cross-sectional view taken along II-II' of FIG. 7.

It should be noted that FIG. 7 only illustrates some elements of the present disclosure, i.e., the gate electrode of the driving TFT and adjacent signal lines, for convenience of explanation.

Referring to FIGS. 7 and 8, the gate electrode DG of the driving TFT and a plurality of signal lines adjacent to the gate electrode DG are formed, or located, in a pixel in the organic light emitting diode display. For example, the signal lines may comprise a first data line DL1, a first power supply line VDL, a 1a gate line GL1a, a 1b gate line GL1b, and a 1c gate line GL1c. A data voltage is applied to the first data line DL1. A high supply voltage is applied to the first power supply line VDL. Gate signals from the gate drive circuit are applied to the 1a gate line GL1a, 1b gate line GL1b, and 1c gate line GL1c.

The gate electrode DG of the driving TFT DT is located on a substrate SUB. A first insulating layer IN1 may be further formed, or located, under the gate electrode DG. The first data line DL1 is located on a layer that is above the gate electrode DG of the driving TFT DT and spaced horizontally apart from the gate electrode DG with a second insulating layer IN2 and a third insulating layer IN3 interposed between them. A parasitic capacitor Cgd is formed between the gate electrode DG of the driving TFT DT and the first data line DL1.

The organic light emitting diode display according to the second exemplary embodiment of the present disclosure further comprises a first shielding electrode TM and a second shielding electrode BM.

The first shielding electrode TM is provided above the gate electrode DG of the driving TFT DT. The first shielding electrode TM is provided between the gate electrode DG of the driving TFT DT and the first data line DL1. The first shielding electrode TM is located on a different layer than the gate electrode DG of the driving TFT DT, with the second insulating layer IN2 between them. The first shielding electrode TM is located on a different layer than the first data line DL1, with the third insulating layer IN3 between them The first shielding electrode TM overlaps the gate electrode DG of the driving DFT DT in such a way that fully covers the end IS_G of the gate electrode DG adjacent to the first data line DL1. In an area adjacent to the first data line DL1, the end IS_T of the first shielding electrode TM extends further towards the first data line DL1 than the end IS_G of the gate electrode DG. Accordingly, the end IS_T of the first shielding electrode TM is located closer in the horizontal direction to the first data line DL1 than the end IS_G of the gate electrode DG is.

The first shielding electrode TM is connected to a static voltage source. In other words, the first shielding electrode TM may be connected to a constant voltage source. For example, the static voltage source may be a high voltage source EVDD. To this end, the first shielding electrode TM may be electrically connected to the first power supply line VDL through a first contact hole TH.

The second shielding electrode BM is provided below the gate electrode DG of the driving TFT DT. The second shielding electrode BM is located on a different layer than the gate electrode DG of the driving TFT DT, with the first insulating layer IN1 between them.

The second shielding electrode BM overlaps the gate electrode DG of the driving DFT DT. In an area adjacent to the first data line DL1, the end IS_B of the second shielding electrode BM extends further towards the first data line DL1 than the end IS_G of the gate electrode DG. Accordingly, the end IS_B of the second shielding electrode BM is located closer in the horizontal direction to the first data line DL1 than the end IS_G of the gate electrode DG.

The second shielding electrode BM is connected to a static voltage source. In other words, the second shielding electrode BM may be connected to a constant voltage source. For example, the static voltage source may be a high voltage source EVDD. To this end, the second shielding electrode BM may be electrically connected to the first power supply line VDL through a second contact hole BH.

When the first shielding electrode TM and the second shielding electrode BM are connected to the static voltage source, the first shielding electrode TM and the second shielding electrode BM maintain a static voltage. A first capacitor C1 is formed from the first shielding electrode TM and the gate electrode DG of the driving TFT DT. That is, the first shielding electrode TM and the gate electrode DG of the driving TFT DT overlap each other, with the second insulating layer IN2 between them, thereby forming the first capacitor C1. A second capacitor C2 is formed between the second shielding electrode BM and the gate electrode DG of the driving TFT DT. That is, the second shielding electrode BM and the gate electrode DG of the driving TFT DT overlap each other, with the first insulating layer IN1 between them, thereby forming the second capacitor C2 between them.

The greater the capacitance of a capacitor, the larger the amount of charge in the capacitor. When a plurality of capacitors are connected to the gate electrode DG of the driving TFT DT, the gate voltage at the gate electrode DG is primarily affected by the capacitor with a higher capacitance. The first capacitor C1 and the second capacitor C2 have a higher capacitance value than the parasitic capacitor Cgd between the first data line DL1 and the gate electrode DG of the driving TFT DT, and this reduces the effect of the parasitic capacitor Cgd on the gate electrode DG of the driving TFT DT. Due to this, the gate voltage at the driving TFT DT is not affected by the parasitic capacitor Cgd; thus, it is not sensitive to changes in data voltage.

Since the voltage at the first shielding electrode TM connected to the first capacitor C1 is constant, the voltage at the gate electrode DG is not affected by the voltage at the first shielding electrode TM even though the gate electrode DG of the driving TFT DT is coupled to the first shielding electrode TM through the first capacitor C1. In the present disclosure, in order for the first capacitor C1 to have a higher capacitance than the parasitic capacitor Cgd, it is preferable that the first shielding electrode TM extends further towards the first data line DL1 than the gate electrode DG of the driving TFT DT does, so as to overlap the gate electrode DG over a wide area.

Since the voltage at the second shielding electrode BM connected to the second capacitor C2 is constant, the voltage at the gate electrode DG is not affected by the voltage at the second shielding electrode BM even though the gate electrode DG of the driving TFT DT is coupled to the second shielding electrode BM through the second capacitor C2. In an embodiment of the present disclosure, in order for the second capacitor C2 to have a higher capacitance than the parasitic capacitor Cgd, it is preferable that the second shielding electrode BM extends further towards the first data line DL1 than the gate electrode DG of the driving TFT DT does, so as to overlap the gate electrode DG over a wide area.

The first shielding electrode TM extending further towards the first data line DL1 provides an electric field (E) shielding effect in the upward direction from the gate electrode DG of the driving TFT DT. In other words, the first shielding electrode TM may exist between the gate electrode DG of the driving TFT DT and the first data line DL1 to shield an upward electric field E formed between them, thereby keeping the gate voltage at the driving TFT DT from being affected by the data voltage. The second shielding electrode BM extending further towards the first data line DL1 provides an electric field (E) shielding effect in the downward direction from the gate electrode DG of the driving TFT DT. In other words, the second shielding electrode BM may exist below the gate electrode DG of the driving TFT DT to shield a downward electric field E formed between them, thereby keeping the gate voltage at the driving TFT DT from being affected by the data voltage.

As discussed above, it is preferable that the end IS_T of the first shielding electrode TM extends further towards the first data line DL1 than the end IS_G of the gate electrode DG does, in order to give the first capacitor C1 a higher capacitance value than that of the parasitic capacitor Cgd and to shield the upward electric field E formed between the gate electrode DG of the driving TFT DT and the first data line DL1. Also, it is preferable that the end IS_B of the second shielding electrode BM extends further towards the first data line DL1 than the end IS_G of the gate electrode DG does, in order to give the second capacitor C2 a higher capacitance value than that of the parasitic capacitor Cgd and to shield the downward electric field E formed between the gate electrode DG of the driving TFT DT and the first data line DL1. With the first shielding electrode TM and the second shielding electrode BM both extending further towards the first data line DL1, an embodiment of the present disclosure can minimize the effect of the data voltage on the gate electrode DG of the driving TFT DT and, as a result, prevent a vertical crosstalk that occurs when the gate voltage at the driving TFT DT changes with a change in data voltage.

The first capacitor C1 and the second capacitor C2 both function as a storage capacitor. It is preferable that both the first shielding electrode TM and the second shielding electrode BM overlap the gate electrode DG of the driving TFT DT across a wide area, in order for the storage capacitor to have a sufficient capacitance. Therefore, when the storage capacitor has sufficient capacitance, an embodiment of the present disclosure can improve the ability of the pixels to maintain data and suppress pixel voltage discharge when the pixels run at a low refresh rate for reduced power consumption, thereby enhancing picture quality even at low refresh rates.

Moreover, an embodiment of the present disclosure allows the storage capacitor to have a sufficient capacitance in a limited area since a dual storage capacitor can be formed, or located, vertically. Accordingly, the second exemplary embodiment of the present disclosure may be applicable to organic light emitting diode displays with high resolution that require a storage capacitor in a limited area.

The second exemplary embodiment of the present disclosure includes a first shielding electrode TM and a second shielding electrode BM, so that a gate voltage applied to the driving TFT DT's gate electrode DG is not affected by changes in the voltage of an adjacent line. The adjacent line is not limited to the above-described data line to which a data voltage is applied. The adjacent line may include any line, as long as a signal different from the gate voltage applied to the gate electrode DG of the driving TFT DT is applied to the adjacent line and the adjacent line is located adjacent to the gate electrode DG of the driving TFT DT. For example, referring to the drawing, the adjacent line may include the 1a gate line GL1a, the 1b gate line GL1b, and the 1c gate line GL1c.

Although embodiments have been described with reference to a number of illustrative embodiments thereof, it should be understood that numerous other modifications and embodiments can be devised by those skilled in the art that will fall within the scope of the principles of this disclosure. More particularly, numerous variations and modifications are possible in the component parts and/or arrangements of the subject combination arrangement within the scope of the appended claims. In addition to variations and modifications in the component parts and/or arrangements, alternative uses will also be apparent to those skilled in the art.

What is claimed is:

1. An organic light emitting display comprising:
   a substrate;
   a pixel having a driving thin film transistor for adjusting a current flowing through an organic light emitting diode based on a voltage applied to a gate electrode of the driving thin film transistor;
   a signal line adjacent to the gate electrode of the driving thin film transistor;
   a first shielding electrode located above the gate electrode of the driving thin film transistor, wherein an end region of the first shielding electrode between the gate electrode and the signal line has a stepped shape that steps down toward the substrate; and
   a first insulating layer between the first shielding electrode and the gate electrode,
   wherein the first shielding electrode extends further towards the signal line than the gate electrode of the driving thin film transistor extends towards the signal line.

2. The organic light emitting display of claim 1, wherein a distance between the signal line and the first shielding electrode is shorter than a distance between the signal line and the gate electrode of the driving thin film transistor.

3. The organic light emitting display of claim 1, wherein the first shielding electrode is connected to a constant voltage source.

4. The organic light emitting display of claim 1, wherein the first shielding electrode and the gate electrode are a first capacitor.

5. The organic light emitting display of claim 4, wherein:
   a parasitic capacitor is formed between the signal line and the gate electrode of the driving thin film transistor;
   the first capacitor is formed by overlapping of the first shielding electrode and the gate electrode of the driving thin film transistor; and
   the first capacitor has a higher capacitance than the parasitic capacitor.

6. The organic light emitting display of claim 4, wherein the first capacitor is configured to suppress pixel voltage discharge.

7. The organic light emitting display of claim 1, wherein the organic light emitting display further comprises:
   a second shielding electrode located below the gate electrode of the driving thin film transistor; and
   a second insulating layer between the second shielding electrode and the gate electrode,
   wherein the second shielding electrode extends further towards the signal line than the gate electrode of the driving thin film transistor extends towards the signal line.

8. The organic light emitting diode display of claim 7, wherein a distance between the signal line and the second shielding electrode is shorter than a distance between the signal line and the gate electrode of the driving thin film transistor.

9. The organic light emitting display of claim 7, wherein the second shielding electrode is connected to a constant voltage source.

10. The organic light emitting display of claim 7, wherein the first shielding electrode and the second shielding electrode are both connected to a same constant voltage source.

11. The organic light emitting display of claim 7, wherein the second shielding electrode and the gate electrode are a second capacitor.

12. The organic light emitting diode display of claim 11, wherein:
    a parasitic capacitor is formed between the signal line and the gate electrode of the driving thin film transistor;
    the second capacitor is formed by overlapping of the second shielding electrode and the gate electrode of the driving thin film transistor; and
    the second capacitor has a higher capacitance than the parasitic capacitor.

13. The organic light emitting display of claim 11, wherein the second capacitor is configured to suppress pixel voltage discharge.

14. The organic light emitting display of claim 1, wherein the pixel has a six transistor and one capacitor structure, wherein the signal line is a first data line, and wherein the six transistor and one capacitor structure comprises:
    a first thin film transistor comprising a gate electrode connected to a first gate line, a first electrode connected to the first data line, and a second electrode connected to one end of a storage capacitor;
    a second thin film transistor comprising a gate electrode connected to a second gate line, a first electrode connected to the gate electrode of the driving thin film transistor, and a second electrode connected to a second electrode of the driving thin film transistor;
    a third thin film transistor comprising a gate electrode connected to a third gate line, a first electrode connected to a reference voltage line, and a second electrode connected to one end of the storage capacitor;
    a fourth thin film transistor comprising a gate electrode connected to the third gate line, a first electrode connected to the second electrode of the driving thin film transistor, and a second electrode connected to the anode of the organic light emitting diode;
    a fifth thin film transistor comprising a gate electrode connected to the second gate line, a first electrode connected to the reference voltage line, and a second electrode connected to the anode of the organic light emitting diode; and the driving thin film transistor comprising the gate electrode connected to the other end of the storage capacitor, a first electrode connected to a first power supply, and a second electrode connected to the first electrode of the fourth thin film transistor.

15. A light emitting display comprising:
a substrate;
a pixel having a driving thin film transistor to adjust a current flowing through a light emitting diode based on a voltage at a gate electrode of the driving thin film transistor;
a signal line adjacent to the gate electrode of the driving thin film transistor; and
a first shielding electrode overlapping with the gate electrode of the driving thin film transistor to provide electric field shielding between the signal line and the gate electrode, the signal line being closer to the first shielding electrode than the gate electrode of the driving thin film transistor, and wherein an end region of the first shielding electrode between the gate electrode and the signal line has a stepped shape that steps down toward the substrate.

16. The light emitting display of claim 15, wherein the first shielding electrode overlaps with an end of the gate electrode that is closest to the signal line.

17. The light emitting display of claim 15, wherein the first shielding electrode is connected to a constant voltage source.

18. The light emitting display of claim 15, wherein the first shielding electrode is located in a layer between a layer of the gate electrode and a layer of the signal line.

19. The light emitting display of claim 15, further comprising:
a second shielding electrode overlapping with the gate electrode of the driving thin film transistor to provide electric field shielding between the signal line and the gate electrode, the gate electrode being between the first shielding electrode and the second shielding electrode, the signal line being closer to the second shielding electrode than the signal line is to the gate electrode of the driving thin film transistor.

20. An organic light emitting display comprising:
a pixel having a driving thin film transistor for adjusting a current flowing through an organic light emitting diode based on a voltage applied to a gate electrode of the driving thin film transistor;
a signal line adjacent to the gate electrode of the driving thin film transistor;
a first shielding electrode located above the gate electrode of the driving thin film transistor;
a first insulating layer between the first shielding electrode and the gate electrode; and
a second insulating layer on the first shielding electrode, wherein the signal line is on the second insulating layer,
wherein the first shielding electrode extends further towards the signal line than the gate electrode of the driving thin film transistor extends towards the signal line, and covers at least one end of the gate electrode adjacent to the signal line.

* * * * *